(12) United States Patent
Roehrig et al.

(10) Patent No.: US 10,227,688 B2
(45) Date of Patent: Mar. 12, 2019

(54) MOISTURE RESISTANT COATING FOR BARRIER FILMS

(71) Applicant: 3M INNOVATIVE PROPERTIES COMPANY, St. Paul, MN (US)

(72) Inventors: Mark A. Roehrig, Stillwater, MN (US); Alan K. Nachtigal, Minneapolis, MN (US); Mark D. Weigel, Hugo, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 353 days.

(21) Appl. No.: 14/987,091

(22) Filed: Jan. 4, 2016

(65) Prior Publication Data

US 2016/0115582 A1    Apr. 28, 2016

Related U.S. Application Data

(63) Continuation of application No. 12/829,535, filed on Jul. 2, 2010, now Pat. No. 9,254,506.

(51) Int. Cl.
*C23C 14/08* (2006.01)
*B05D 1/00* (2006.01)
(Continued)

(52) U.S. Cl.
CPC ............ *C23C 14/081* (2013.01); *B05D 1/60* (2013.01); *B05D 3/068* (2013.01); *B05D 7/04* (2013.01);
(Continued)

(58) Field of Classification Search
None
See application file for complete search history.

(56) References Cited

U.S. PATENT DOCUMENTS

| | | |
|---|---|---|
| 3,444,129 A | 5/1969 | Young, Jr. et al. |
| 3,460,961 A | 8/1969 | Young, Jr. et al. |

(Continued)

FOREIGN PATENT DOCUMENTS

| | | |
|---|---|---|
| JP | 2007-261020 | 10/2007 |
| JP | 2010-005817 | 1/2010 |

(Continued)

OTHER PUBLICATIONS

Shaw et al., "A New Vapor Deposition Process for Coating Paper and Polymer Webs", 6th International Vacuum Coating Conference (1992).

(Continued)

*Primary Examiner* — Kenneth J Stachel
(74) *Attorney, Agent, or Firm* — Clifton F. Richardson; Lance L. Vietzke

(57) ABSTRACT

A barrier film having a substrate, a base polymer layer applied to the substrate, an oxide layer applied to the base polymer layer, and a top coat polymer layer applied to the oxide layer. An optional inorganic layer can be applied over the top coat polymer layer. The top coat polymer includes a silane and an acrylate co-deposited to form the top coat layer. The use of a silane co-deposited with an acrylate to form the top coat layer of the barrier films provide for enhanced resistance to moisture and improved peel strength adhesion of the top coat layer to the underlying barrier stack layers.

10 Claims, 1 Drawing Sheet

(51) Int. Cl.

| | |
|---|---|
| *B05D 3/06* | (2006.01) |
| *B05D 7/04* | (2006.01) |
| *C23C 14/34* | (2006.01) |
| *C08J 7/04* | (2006.01) |
| *C23C 14/10* | (2006.01) |
| *C23C 14/12* | (2006.01) |
| *C23C 14/24* | (2006.01) |
| *C23C 14/54* | (2006.01) |
| *B05D 7/00* | (2006.01) |
| *H01L 51/52* | (2006.01) |

(52) U.S. Cl.
CPC .............. *C08J 7/045* (2013.01); *C23C 14/08* (2013.01); *C23C 14/10* (2013.01); *C23C 14/12* (2013.01); *C23C 14/24* (2013.01); *C23C 14/34* (2013.01); *C23C 14/54* (2013.01); *B05D 7/586* (2013.01); *B05D 2252/02* (2013.01); *H01L 51/5256* (2013.01); *Y10T 428/31663* (2015.04)

(56) References Cited

U.S. PATENT DOCUMENTS

| | | | |
|---|---|---|---|
| 3,492,261 A | 1/1970 | Young, Jr. et al. | |
| 3,503,779 A | 3/1970 | Young, Jr. et al. | |
| 4,329,384 A | 5/1982 | Vesley et al. | |
| 4,330,590 A | 5/1982 | Vesley | |
| 4,379,201 A | 4/1983 | Heilmann et al. | |
| 4,696,719 A | 9/1987 | Bischoff | |
| 4,722,515 A | 2/1988 | Ham | |
| 4,737,559 A | 4/1988 | Kellen et al. | |
| 4,842,893 A | 6/1989 | Yializis et al. | |
| 4,954,371 A | 9/1990 | Yializis | |
| 5,018,048 A | 5/1991 | Shaw et al. | |
| 5,032,461 A | 7/1991 | Shaw et al. | |
| 5,073,611 A | 12/1991 | Rehmer et al. | |
| 5,097,800 A | 3/1992 | Shaw et al. | |
| 5,125,138 A | 6/1992 | Shaw et al. | |
| 5,440,446 A | 8/1995 | Shaw et al. | |
| 5,464,667 A | 11/1995 | Kohler et al. | |
| 5,540,978 A | 7/1996 | Schrenk | |
| 5,547,908 A | 8/1996 | Furuzawa et al. | |
| 5,552,678 A | 9/1996 | Tang et al. | |
| 5,877,895 A | 3/1999 | Shaw et al. | |
| 6,010,751 A | 1/2000 | Shaw et al. | |
| 6,045,864 A | 4/2000 | Lyons et al. | |
| 6,144,222 A | 11/2000 | Ho | |
| 6,214,422 B1 | 4/2001 | Yializis | |
| 6,231,939 B1 | 5/2001 | Shaw et al. | |
| 6,306,507 B1 | 10/2001 | Brunelle et al. | |
| 6,348,237 B2 | 2/2002 | Kohler et al. | |
| 6,359,392 B1 | 3/2002 | He | |
| 6,449,093 B2 | 9/2002 | Hebrink et al. | |
| 6,686,008 B1* | 2/2004 | Merlin ................... | B65D 65/38 428/35.7 |
| 6,706,412 B2 | 3/2004 | Yializis | |
| 6,744,561 B2 | 6/2004 | Condo et al. | |
| 6,783,349 B2 | 8/2004 | Neavin et al. | |
| 6,866,901 B2 | 3/2005 | Burrows et al. | |
| 6,878,400 B2 | 4/2005 | Colombo et al. | |
| 7,015,640 B2 | 3/2006 | Schaepkens et al. | |
| 7,018,713 B2 | 3/2006 | Padiyath et al. | |
| 7,074,501 B2 | 7/2006 | Czeremuszkin et al. | |
| 7,323,514 B2 | 1/2008 | Jing et al. | |
| 7,378,157 B2 | 5/2008 | Sakakura | |
| 7,379,157 B2 | 5/2008 | Nagasaka | |
| 7,485,371 B2 | 2/2009 | Jing et al. | |
| 7,489,086 B2 | 2/2009 | Miskin et al. | |
| 7,560,168 B2 | 7/2009 | Tanaka et al. | |
| 2002/0022156 A1 | 2/2002 | Bright | |
| 2003/0029493 A1 | 2/2003 | Plessing | |
| 2003/0099895 A1 | 5/2003 | Barthel et al. | |
| 2003/0203210 A1 | 10/2003 | Graff | |
| 2004/0077892 A1 | 4/2004 | Arkles et al. | |
| 2004/0247899 A1 | 12/2004 | Bier | |
| 2004/0253428 A1 | 12/2004 | Wang et al. | |
| 2006/0062937 A1 | 3/2006 | Padiyath et al. | |
| 2006/0084780 A1 | 4/2006 | Hebrink et al. | |
| 2007/0020451 A1 | 1/2007 | Padiyath et al. | |
| 2007/0087281 A1 | 4/2007 | Patel et al. | |
| 2008/0196664 A1 | 8/2008 | David et al. | |
| 2008/0252229 A1 | 10/2008 | Wu | |
| 2009/0130463 A1 | 5/2009 | Albaugh et al. | |
| 2009/0174337 A1 | 7/2009 | Miskin et al. | |
| 2009/0174343 A1 | 7/2009 | Lenz et al. | |
| 2013/0302627 A1* | 11/2013 | Roehrig ................ | B32B 27/308 428/447 |
| 2017/0252971 A1* | 9/2017 | Umebayashi ....... | B29C 67/0059 |

FOREIGN PATENT DOCUMENTS

| | | |
|---|---|---|
| JP | 2011-246392 | 12/2011 |
| WO | WO 00/26973 | 5/2000 |
| WO | WO 00/61664 | 10/2000 |
| WO | WO 2007/087281 | 8/2007 |
| WO | WO 2008/083304 | 7/2008 |

OTHER PUBLICATIONS

Shaw et al., "Use of Evaporated Acrylate Coatings to Smooth the Surface of Polyester and Polypropylene Film Substrates", RadTech (1996).

Yasuda, "Plasma Polymerization," Academic Press Inc., New York (1985).

R.d'Agostino (Ed), "Plasma Deposition, Treatment & Etching of Polymers," Academic Press, New York (1990).

Biederman et al., "Plasma Polymerization Processes," Elsever, New York (1992).

Affinito et al., "Vacuum deposited polymer/metal multilayer films for optical application", Thin Solid Films, 270 (1995) pp. 43-48.

Shaw et al., "A New High Speed Process for Vapor Depositing Acrylate Thin Films: An Update", Society of Vacuum Coaters 36th Annual Technical Conf Proceedings (1993) pp. 348-351.

Shaw et al., "Use of Vapor Deposited Acrylate Coatings to Improve the Barrier Properties of Metallized Film", Society of Vacuum Coaters 37th Annual Technical Conf Proceedings (1994) pp. 240-244.

Affinito et al., "Polymer-Oxide Transparent Barrier Layers", Society of Vacuum Coaters 39th Annual Technical Conf Proceedings (1996) pp. 392-397.

Swanson, "Measurement of Web Curl" presented in the 2006 AWEB conference proceedings (Association of Industrial Metallizers, Coaters and Laminators, Applied Web Handling Conference Proceedings, 2006).

Arkles, "Cyclic Azasilanes: Volatile Coupling Agents for Nanotechnology", Silanes and Other Agents, vol. 3. pp. 179-191, Ed. K. L. Mittal, 2004.

Seth et al., "Characterization of one-step, chromate-free, primer systems using liquid-state Si and C NMR" Progress in Organic Coatings, vol. 60, 2007, pp. 170-177.

Supplementary European Search Report for EP 11801355, completed Mar. 5, 2014.

* cited by examiner

MOISTURE RESISTANT COATING FOR BARRIER FILMS

REFERENCE TO RELATED APPLICATION

The present application, which is a continuation of U.S. patent application Ser. No. 12/829535, filed on Jul. 2, 2010, is related to U.S. Patent Publication Number 2012/0003451 (Weigel et al.) which is hereby incorporated herein by reference as if fully set forth.

BACKGROUND

Multilayer stacks of polymers and oxides are deposited in a single pass coating process on flexible plastic films to make high barrier films resistant to moisture permeation. Examples of these barrier films are described in U.S. Pat. Nos. 5,440,446; 5,877,895; and 6,010,751, all of which are incorporated herein by reference as if fully set forth. These high barrier films have a number of applications in the display, lighting, and solar markets as flexible replacements for glass encapsulating materials. However, under certain conditions multilayer stacks of polymers and oxides may suffer degradation in adhesion performance after extended exposure to moisture, possibly causing these high barrier stacks to delaminate at the oxide-polymer interface and causing the flexible plastic film to detach from the device.

One solution to this problem is to use what is referred to as a "tie" layer of particular elements such chromium, zirconium, titanium, silicon and the like, which are often sputter deposited as a mono- or thin-layer of the material either as the element or in the presence of small amount of oxygen. The tie layer element can then form chemical bonds to both the substrate layer, an oxide, and the capping layer, a polymer.

Tie layers are generally used in the vacuum coating industry to achieve adhesion between layers of differing materials. The process used to deposit the layers often requires fine tuning to achieve the right layer concentration of tie layer atoms. The deposition can be affected by slight variations in the vacuum coating process such as fluctuation in vacuum pressure, out-gassing, and cross contamination from other processes resulting in variation of adhesion levels in the product. In addition, tie layers often do not retain their initial adhesion levels after exposure to water vapor. A more robust solution for adhesion improvement in barrier films is desirable.

SUMMARY

A barrier film, consistent with the present invention, includes a substrate, a base polymer layer applied to the substrate, an oxide layer applied to the base polymer layer, and a top coat polymer layer applied to the oxide layer. The top coat polymer includes a silane and an acrylate co-deposited to form the top coat layer. An optional inorganic layer can be applied over the top coat polymer layer.

A process for making a barrier film, consistent with the present invention, includes the steps of providing a substrate, applying a base polymer layer to the substrate, applying an oxide layer to the base polymer layer, and co-depositing a silane and an acrylate to form a top coat polymer layer on the oxide layer.

The use of a silane co-deposited with an acrylate to form the top coat layer of the barrier film provides for enhanced resistance to moisture and improved peel strength adhesion of the top coat layer to the underlying barrier stack layers.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1:
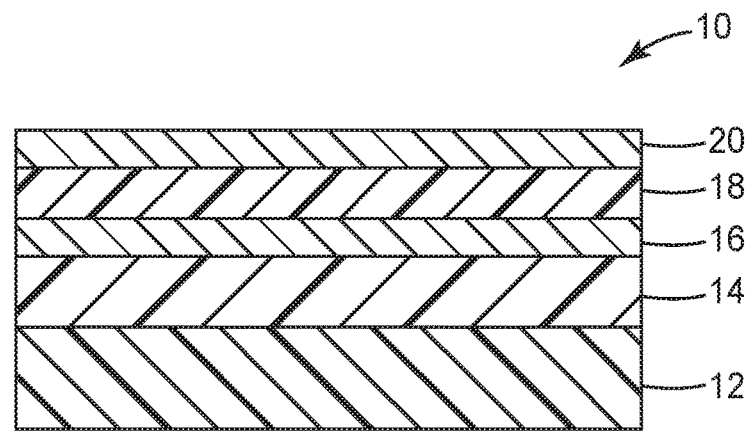
FIG. 1 is a diagram of a barrier film having a moisture resistant coating.

FIG. 1 is a diagram of a barrier film 10 having a moisture resistant coating. Film 10 includes layers arranged in the following order: a substrate 12; a base polymer layer 14; an inorganic layer 16; a top coat polymer layer 18; and an optional inorganic layer 20. Base polymer layer 14 and inorganic layer 16 together form a dyad and, although only one dyad is shown, film 10 can include additional alternating layers of base polymer and oxide between substrate 10 and top coat polymer layer 18. A silane is co-deposited with an acrylate to form top coat polymer layer 18, which improves the moisture resistance of film 10 and the peel strength adhesion of top coat polymer layer 18 to the underlying barrier stack layers, as explained below. Materials for the layers of barrier film 10 are identified in the Examples.

Volatilizable acrylate and methacrylate monomers are useful for forming the base and top coat polymer layers. In some embodiments, volatilizable acrylates are used. Volatilizable acrylate and methacrylate monomers may have a molecular weight in the range from about 150 to about 600 grams per mole, or, in some embodiments, from about 200 to about 400 grams per mole. In some embodiments, volatilizable acrylate and methacrylate monomers have a value of the ratio of the molecular weight to the number of (meth)acrylate functional groups per molecule in the range from about 150 to about 600 g/mole/(meth)acrylate group, in some embodiments, from about 200 to about 400 g/mole/(meth)acrylate group. Fluorinated acrylates and methacrylates can be used at higher molecular weight ranges or ratios, for example, about 400 to about 3000 molecular weight or about 400 to about 3000 g/mole/(meth)acrylate group. Exemplary useful volatilizable acrylates and methacrylates include hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)isocyanurate triacrylate, pentaerythritol triacrylate, phenylthioethyl acrylate, naphthloxyethyl acrylate, cyclic diacrylates (for example, EB-130 from Cytec Industries Inc. and tricyclodecane dimethanol diacrylate, available as SR833S from Sartomer Co.), epoxy acrylate RDX80095 from Cytec Industries Inc., and mixtures thereof.

Useful monomers for forming the base and top coat polymer layers are available from a variety of commercial sources and include urethane acrylates (e.g., available from Sartomer Co., Exton, Pa. under the trade designations "CN-968" and "CN-983"), isobornyl acrylate (e.g., available from Sartomer Co. under the trade designation "SR-506"), dipentaerythritol pentaacrylates (e.g., available from Sartomer Co. under the trade designation "SR-399"), epoxy acrylates blended with styrene (e.g., available from Sartomer Co. under the trade designation "CN-120S80"), di-trimethylolpropane tetraacrylates (e.g., available from Sartomer Co. under the trade designation "SR-355"), diethylene glycol diacrylates (e.g., available from Sartomer Co. under the trade designation "SR-230"), 1,3-butylene glycol diacrylate (e.g., available from Sartomer Co. under the trade designation "SR-212"), pentaacrylate esters (e.g., available from Sartomer Co. under the trade designation "SR-9041"), pentaerythritol tetraacrylates (e.g., available from Sartomer Co. under the trade designation "SR-295"), pentaerythritol triacrylates (e.g., available from Sartomer Co. under the trade designation "SR-444"), ethoxylated (3) trimethylolpropane triacrylates (e.g., available from Sartomer Co. under the trade designation "SR-454"), ethoxylated (3) trimethylolpropane triacrylates (e.g., available from Sartomer Co. under the trade designation "SR-454HP"), alkoxylated trifunctional acrylate esters (e.g., available from Sartomer Co. under the trade designation "SR-9008"), dipropylene glycol diacrylates (e.g., available from Sartomer Co. under the trade designation "SR-508"), neopentyl glycol diacrylates (e.g., available from Sartomer Co. under the trade designation "SR-247"), ethoxylated (4) bisphenol a dimethacrylates (e.g., available from Sartomer Co. under the trade designation "CD-450"), cyclohexane dimethanol diacrylate esters (e.g., available from Sartomer Co. under the trade designation "CD-406"), isobornyl methacrylate (e.g., available from Sartomer Co. under the trade designation "SR-423"), cyclic diacrylates (e.g., available from UCB Chemical, Smyrna, Ga., under the trade designation "IRR-214") and tris (2-hydroxy ethyl) isocyanurate triacrylate (e.g., available from Sartomer Co. under the trade designation "SR-368"), acrylates of the foregoing methacrylates and methacrylates of the foregoing acrylates.

In some embodiments, one of the polymer layers (e.g., the top coat polymer layer) in the barrier film can be formed from co-depositing a silane (e.g., an amino silane or cyclic aza-silane) and a radiation-curable monomer (e.g., any of the acrylates listed above). Co-depositing includes co-evaporating and evaporating a mixture of the silane and the monomer. Cyclic aza-silanes are ring compounds, wherein at least one of the ring members is a nitrogen and at least one of the ring members is a silicon, and wherein the ring contains at least one nitrogen-to-silicon bond. In some embodiments, the cyclic aza-silane is represented by the general formula

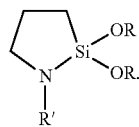

In other embodiments, the cyclic aza-silane is represented by the general formula

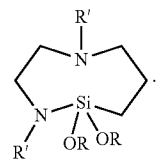

In either of these embodiments, each R is independent alkyl having up to 12, 6, 4, 3, or 2 carbon atoms and R' is hydrogen, alkyl, or alkenyl with alkyl and alkenyl each having up to 12, 6, 4, 3, or 2 carbon atoms and optionally substituted by amino. Exemplary cyclic aza-silanes include 2,2-dimethoxy-N-butyl-1-aza-2-silacyclopentane, 2-methyl-2-methoxy-N-(2-aminoethyl)-1-aza-2-silacyclopentane, 2,2-diethoxy-N-(2-aminoethyl)-1-aza-2-silacyclopentane, 2,2-dimethyl-N-allyl-1-aza-2-silacyclopentane, 2,2-dimethoxy-N-methyl-1-aza-2-silacyclopentane, 2,2-diethoxy-1-aza-2-silacyclopentane, 2,2-dimethoxy-1,6-diaza-2-silacyclooctane, and N-methyl-1-aza-2,2,4-trimethylsilacyclopentane. When the cyclic aza-silane is placed in the presence of a hydroxyl (e.g., silanol) group it quickly reacts to form a Si—O—Si (siloxane) linkage from the oxide surface to the co-condensed pre-polymer while the nitrogen moiety becomes a reactive amine on the other end of the molecule that can bond with pre-polymer compound(s) during polymerization. Amino silanes, which have the general formula $Z_2N-L-SiY_xY'_{3-x}$, wherein each Z is independently hydrogen or alkyl having up to 12 carbon atoms, L is alkylene having up to 12 carbon atoms, Y is a hydrolysable group (e.g., alkoxy having up to 12 carbon atoms or halogen), and Y' is a non-hydrolysable group (e.g., alkyl having up to 12 carbon atoms) have silane groups capable of forming siloxane bond with a metal oxide surface and amino groups capable of reacting with polymerizable compounds (e.g., acrylates). Exemplary amino silanes include (e.g., 3-aminopropyltrimethoxysilane; 3-aminopropyltriethoxysilane; 3-(2-aminoethyl)aminopropyltrimethoxysilane; N-(2-aminoethyl)-3-aminopropylmethyldimethoxysilane, bis-(gamma-triethoxysilylpropyl)amine; N-(2-aminoethyl)-3-aminopropyltributoxysilane; 6-(aminohexylaminopropyl)trimethoxysilane; 4-aminobutyltrimethoxysilane; 4-aminobutyltriethoxysilane; 3-aminopropyltris(methoxyethoxyethoxy)silane; 3-aminopropylmethyldiethoxysilane; 3-(N-methylamino)propyltrimethoxysilane; N-(2-aminoethyl)-3-aminopropylmethyldimethoxysilane; N-(2-aminoethyl)-3-aminopropylmethyldiethoxysilane; N-(2-aminoethyl)-3-aminopropyltrimethoxysilane; N-(2-aminoethyl)-3-aminopropyltriethoxysilane; 3-aminopropylmethyldiethoxysilane; 3-aminopropylmethyldimethoxysilane; 3-aminopropyldimethylmethoxysilane; and 3-aminopropyldimethylethoxysilane). Accordingly, in some embodiments, the barrier film comprises an inorganic layer that shares a chemical bond (e.g., a siloxane bond) with one or more organic layers. For example, a hydroxyl group derived from a metal oxide can react with a silane group on an amino silane or cyclic aza-silane. The amount of water vapor present in a multi-process vacuum chamber, for example, can be controlled to promote the formation of such hydroxyl groups in high enough surface concentration to provide increased bonding sites. With residual gas monitoring and the use of water vapor sources, for example, the amount of water vapor in a vacuum chamber can be controlled to ensure adequate generation of hydroxyl (e.g., Si—OH) groups.

Figure 2:
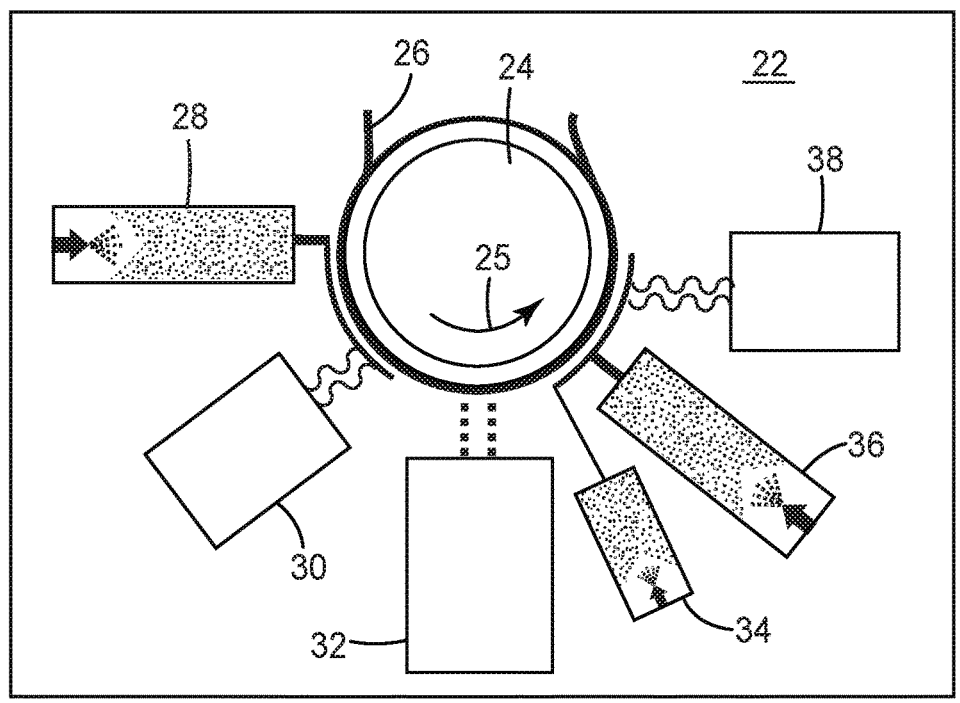
FIG. 2 is a diagram illustrating a process for making a barrier film.

FIG. 2 is a diagram of a system 22, illustrating a process for making barrier film 10. System 22 is contained within an inert environment and includes a chilled drum 24 for receiving and moving substrate 10 as represented by a film 26 providing a moving web. An evaporator 28 applies a base polymer, which is cured by curing unit 30 to form base polymer layer 14 as drum 24 advances the film in a direction shown by arrow 25. An oxide sputter unit 32 applies an oxide to form layer 16 as drum 24 advances film 26. For additional alternating layers of base polymer and oxide, drum 24 can rotate in a reverse direction opposite arrow 25 and then advance film 26 again to apply the additional alternating base polymer and oxide layers, and that sub-process can be repeated for as many alternating layers as desired or needed. Once the alternating layers of base polymer and oxide are complete, drum 24 further advances the film, and an evaporator 34 deposits a silane and evaporator 36 deposits an acrylate. The silane and acrylate are co-deposited and, as drum 24 advances the film, are cured together by curing unit 38 to form top coat polymer 18. Co-depositing the silane and acrylate can involve co-evaporating the materials or evaporating a mixture of the materials. As an alternative to an acrylate, a radiation cured monomer can be used with the silane to form the top coat. The layers in FIG. 2 are shown separated for illustrative purposes only; the layers are deposited on one another in the process of making the barrier film. Also, each evaporator would be coupled with a source of the corresponding material to be deposited. The Examples describe in more detail processes using system 22 to make barrier film 10.

The following explains the advantages of using silane in barrier film 10 to form the top coat polymer layer. Silanes are well known in the coating industry to improve adhesion levels between polymer to glass surfaces or to greatly alter surface chemistry, in general, ranging from hydrophilic to hydrophobic. The use of silanes in vapor coating applications has been hindered by the high molecular weights of traditional silane coupling agent compounds. In addition, the hydroxylation step to activate the silane coupling agent to bond to a surface containing hydroxyl groups has hindered their applicability in vapor coating processes. The development of cyclic aza-silanes has enabled vapor process-able silane coupling agent chemistry by reducing molecular weight thus increasing vapor pressure of the coupling agent molecule and by removing the hydrolyzing step of the silane coupling agent since cyclic aza-silanes react directly with a silanol surface.

Cyclic aza-silanes are ringed compounds that contain a silicon atom in the ring bonded to a nitrogen also in the ring. When the cyclic aza-silane is placed in the presence of a hydroxyl (silanol) group it quickly reacts to form a Si—O—Si—R linkage from the oxide surface to the co-condensed pre-polymer while the nitrogen moiety becomes a reactive amine on the other end of the molecule that can bond with pre-polymer compound(s) during polymerization. While the basic cyclic aza-silane chemistry is known, its implementation in the present vapor coating process is not. Another element in the present process is the ability to form hydroxyl silanol (Si—OH) groups on a freshly sputter deposited $SiO_2$ layer. The amount of water vapor present in a multi-process vacuum chamber can be controlled sufficiently to promote the formation of Si—OH groups in high enough surface concentration to provide increased bonding sites. With residual gas monitoring and the use of water vapor sources, the amount of water vapor in a vacuum chamber can be controlled to ensure adequate generation of Si—OH groups.

This process improves the overall adhesion and adhesion retention of vapor deposited multilayer barrier coatings after exposure to moisture by the addition of a cyclic aza-silane coupling agent. The cyclic aza-silane coupling agent is added to a pre-polymer formulation and co-evaporated in a vapor coating process where the cyclic aza-silane pre-polymer formulation condenses onto a moving web substrate that has just been sputter coated with an oxide of silicon and aluminum. The condensed liquid is then polymerized in the same process by electron beam radiation. With the addition of cyclic aza-silane the peel strength of the coating is greatly improved and peel strength adhesion is retained after exposure to high heat and humidity conditions. Additionally, the addition of cyclic aza-silane removes the need for a tie layer, which greatly simplifies the coating process and barrier coating stack construction by removing the tie layer altogether. The resulting barrier coatings retain high barrier properties and optical transmission performance.

EXAMPLES

All parts, percentages, and ratios in the examples are by weight, unless noted otherwise. Solvents and other reagents used were obtained from Sigma-Aldrich Chemical Company; Milwaukee, Wis. unless specified differently.
Materials
90% Si/10% Al targets were obtained from Academy Precision Materials Inc., Albuquerque, N. Mex.
99.999% Si targets were obtained from Academy Precision Materials Inc., Albuquerque, N. Mex.
ETFE film: ethylene-tetrafluoroethylene film available from St. Gobain Performance Plastics, Wayne, N.J. under the trade name "NORTON® ETFE."
ETIMEX® 496.10: EVA film VISTASOLAR® available from ETIMEX Solar GmbH, a subsidiary of SOLUTIA Inc., Dietenheim, Germany.
SR-833S: tricyclodecane dimethanol diacrylate available from Sartomer USA, LLC, Exton, Pa.
Madico tape: back-sheet film commercially available under the trade designation "TAPE" from Madico, Woburn, Mass.
N-n-butyl-aza-2,2-dimethoxysilacyclopentane was obtained from Gelest, Inc., Morrisville, Pa. under the trade name "Cyclic AZA Silane 1932.4."
T-Peel Test Method
Films having a barrier coating were cut to 20 cm (8 inch)×30.5 cm (12 inch) rectangular sections. These sections were then placed into a laminate construction containing a bottom back-sheet (Madico tape), a sheet of ETIMEX 496.10 adjacent to the back-sheet, and the barrier film on top of the EVA sheet with the barrier coating oriented towards the EVA encapsulant. The construction was laminated at 150° C. for 12 minutes and $10^5$ Pa (1 atm) of pressure. Two pieces of plastic material about 25 mm wide by 20 cm long were placed between the barrier film and the EVA layer along both 20 cm long edges to form unbonded edges. The resulting laminate was then cut into 25 mm wide×152 mm long strips such that one end contained the 25 mm unbonded ends that were to be placed in the clamping grips of the test machine. The two unbonded ends of film were placed in a tension testing machine according to ASTM D1876-08 "Standard Test Method for Peel Resistance of Adhesives (T-Peel Test)." A grip distance of 12.7 mm was used and a peel speed of 254 mm/min (10 inches/min) was used. T-Peel testing was completed according to ASTM D1876-08 except where otherwise stated. The peak peel force was measured for three samples and averaged to produce the results.

Comparative Example C-1

An ethylene tetra fluoro ethylene (ETFE) substrate film was covered with a stack of an acrylate smoothing layer, an inorganic silicon aluminum oxide (SiAlOx) barrier layer, a Silicon Oxide (SiOx) layer, an acrylate protective layer, and a second inorganic barrier layer. Barrier assemblies were made on a vacuum coater similar to the coater described in U.S. Pat. No. 5,440,446 (Shaw et al.) and U.S. Pat. No. 7,018,713 (Padiyath, et al.). The individual layers were formed as follows:

(Layer 1—smoothing polymeric layer.) A 350 meter long roll of 0.127 mm thick×366 mm wide ETFE film was loaded into a roll-to-roll vacuum processing chamber. The chamber was pumped down to a pressure of $1 \times 10^{-5}$ Torr. The web speed was maintained at 3.7 meters/min while maintaining the backside of the film in contact with a coating drum chilled to −10° C. With the film in contact with the drum, the film surface was treated with a nitrogen plasma at 0.05 kW of plasma power. The film surface was then coated with tricyclodecane dimethanol diacrylate (SR-833S). The diacrylate was vacuum degassed to a pressure of 20 mTorr prior to coating, and pumped at a flow rate of 1.0 mL/min through an ultrasonic atomizer operated at a frequency of 60 kHz. A flow of 10 standard cubic centimeters per minute (sccm) of nitrogen gas heated to 100° C. was added concentrically to the diacrylate within the ultrasonic atomizer. The diacrylate and gas mixture was introduced into a heated vaporization chamber maintained at 260° C. along with an additional 25 sccm of heated nitrogen gas. The resulting monomer vapor stream condensed onto the film surface and was electron beam crosslinked using a multi-filament electron-beam cure gun operated at 9.0 kV and 3.1 mA to form a 720 nm acrylate layer.

(Layer 2—inorganic layer.) Immediately after the acrylate deposition and with the film still in contact with the drum, a SiAlOx layer was sputter-deposited atop a 350 meter length of the acrylate-coated web surface. Two alternating current (AC) power supplies were used to control two pairs of cathodes, with each cathode housing two 90% Si/10% Al targets. During sputter deposition, the voltage signal from each power supply was used as an input for a proportional-integral-differential control loop to maintain a predetermined oxygen flow to each cathode. The AC power supplies sputtered the 90% Si/10% Al targets using 3500 watts of power, with a gas mixture containing 850 standard cubic centimeters per minute (sccm) argon and 63 sccm oxygen at a sputter pressure of 3.5 mTorr. This provided a 30 nm thick SiAlOx layer deposited atop the Layer 1 acrylate.

(Layer 3—inorganic layer.) Immediately after the SiAlOx deposition and with the film still in contact with the drum, a sub-oxide of silicon (SiOx, where x<2) tie-layer was sputter deposited atop the same 350 meter length of the SiAlOx and acrylate coated web surface using a 99.999% Si target. The SiOx was sputtered using 1000 watts of power, with a gas mixture containing 200 sccm argon and 10 sccm oxygen at a sputter pressure of 1.5 mTorr, to provide a SiOx layer approximately 3 to 6 nm thick atop Layer 2.

(Layer 4—protective polymeric layer.) Immediately after the SiOx layer deposition and with the film still in contact with the drum, a second acrylate (same acrylate as in Layer 1) was coated and crosslinked on the same 350 meter web length using the same general conditions as for Layer 1, but with these exceptions. Electron beam crosslinking was carried out using a multi-filament electron-beam cure gun operated at 9 kV and 0.40 mA. This provided a 720 nm acrylate layer atop Layer 3.

(Layer 5—inorganic layer.) In a separate reverse pass through the roll-to-roll vacuum processing chamber and with the web moving at 3.7 meters/minute, a second SiAlOx (same inorganic as in layer 3) was sputter deposited atop the same 350 meter web length using the same conditions as for Layer 3. This provided a 30 nm thick SiAlOx layer deposited atop the Layer 4 protective acrylate layer.

The resulting five layer stack on the polymeric substrate exhibited an average spectral transmission Tvis=92% (determined by averaging the percent transmission between 400 nm and 700 nm) measured at a 0° angle of incidence. A water vapor transmission rate was measured in accordance with ASTM F-1249 at 50° C. and 100% RH and the result was below the 0.005 g/m²/day lower detection limit rate of the MOCON PERMATRAN-W® Model 700 WVTR testing system (commercially available from MOCON, Inc., Minneapolis, Minn.).

T-peel tests were performed as described under T-Peel Test Method. The initial averaged peak adhesion T-peel pull force was 1.9 N/cm (1.1 lbf/inch). The T-peel test results are summarized in Table 1.

Example 1—Barrier stack made with N-n-butyl-aza-2,2-dimethoxysilacyclopentane

An ethylene tetra fluoro ethylene (ETFE) substrate film was covered with a stack of an acrylate smoothing layer, an inorganic silicon aluminum oxide (SiAlOx) barrier layer, a protective layer made from an acrylate formulation containing SR-833S and N-n-butyl-aza-2,2-dimethoxysilacyclopentane, and a second inorganic barrier layer. Barrier assemblies were made on a vacuum coater similar to the coater described in U.S. Pat. No. 5,440,446 (Shaw et al.) and U.S. Pat. No. 7,018,713 (Padiyath, et al.). The individual layers were formed as follows.

(Layer 1—smoothing polymeric layer.) A roll of 0.127 mm thick×366 mm wide ETFE film was loaded into a roll-to-roll vacuum processing chamber. The chamber was pumped down to a pressure of $1 \times 10^{-5}$ Torr. The web speed was maintained at 3.7 meters/min while maintaining the backside of the film in contact with a coating drum chilled to −10° C. With the film in contact with the drum, the film surface was treated with a nitrogen plasma at 0.05 kW of plasma power. The film surface was then coated with a tricyclodecane dimethanol diacrylate (SR-833S). The diacrylate was vacuum degassed to a pressure of 20 mTorr prior to coating, and pumped at a flow rate of 1.0 mL/min through an ultrasonic atomizer operated at a frequency of 60 kHz. A flow of 10 standard cubic centimeters per minute (sccm) of nitrogen gas heated to 100° C. was added concentrically to the diacrylate within the ultrasonic atomizer. The diacrylate and gas mixture was introduced into a heated vaporization chamber maintained at 260° C. along with an additional 25 sccm of heated nitrogen gas. The resulting monomer vapor stream condensed onto the film surface and was electron beam crosslinked using a mutli-filament electron beam cure gun operated at 9.0 kV and 3.1 mA to form a 720 nm acrylate layer.

(Layer 2—inorganic layer.) Immediately after the acrylate deposition and with the film still in contact with the drum, a SiAlOx layer was sputter-deposited atop a 20 meter length of the acrylate-coated web surface. Two alternating current (AC) power supplies were used to control two pairs of cathodes, with each cathode housing two 90% Si/10% Al targets. During sputter deposition, the voltage signal from each power supply was used as an input for a proportional-integral-differential control loop to maintain a predetermined oxygen flow to each cathode. The AC power supplies sputtered the 90% Si/10% Al targets using 3500 watts of power, with a gas mixture containing 850 sccm argon and 82 sccm oxygen at a sputter pressure of 3.7 mTorr. This provided a 30 nm thick SiAlOx layer deposited atop the Layer 1 acrylate.

(Layer 3—protective polymeric layer.) Immediately after the SiAlOx layer deposition and with the film still in contact with the drum, a second acrylate containing N-n-butyl-aza-2,2-dimethoxysilacyclopentane loaded to 3% into the SR-833S was coated and crosslinked on the same 20 meter web length using the same general conditions as for Layer 1, but with these exceptions. The SR-833S was degassed as in layer one (above) and then before loading into the delivery syringe a 1.5 g (3% by weight) of N-n-butyl-aza-2,2-dimethoxysilacyclopentane was thoroughly stirred in prior to evaporating the formulation. Electron beam crosslinking was carried out using a multi-filament electron-beam cure gun operated at 9 kV and 0.40 mA. This provided a 720 nm acrylate layer atop Layer 3.

(Layer 4—inorganic layer.) In a separate pass through the roll-to-roll vacuum processing chamber and with the web at 3.7 meters/minute, a second SiAlOx (same inorganic as in layer 3) was sputter deposited atop the same 350 meter web length using the same conditions as for Layer 3. This provided a 30 nm thick SiAlOx layer deposited atop the Layer 3 protective acrylate layer.

The resulting four layer stack on the polymeric substrate exhibited an average spectral transmission Tvis=92% (determined by averaging the percent transmission between 400 nm and 700 nm) measured at a 0° angle of incidence. A water vapor transmission rate was measured in accordance with ASTM F-1249 at 50° C. and 100% RH and the result was below the 0.005 g/m$^2$/day lower detection limit rate of the MOCON PERMATRAN-W® Model 700 WVTR testing system (commercially available from MOCON, Inc, Minneapolis, Minn.).

T-peel tests were performed as described under T-Peel Test Method. The initial averaged peak adhesion T-peel pull force was 35.0 N/cm (20.0 lbf/inch). Additional samples were placed into an environmental chamber held at constant temperature of 85° C. and constant 85% relative humidity and aged for 100 and 250 hours. After 100 hours, the averaged peak T-peel measurements were made and the averaged peak adhesion value was 37.1 N/cm (21.2 lbf/in). The resulting averaged peak peel strength after 250 hours was 33.6 N/cm (19.2 lbf/in). The T-peel test results are summarized in Table 1.

TABLE 1

| Example | Initial Peak Peel Force (N/cm) | Peak Peel Force after 100 hr (N/cm) | Peak Peel Force after 250 hr (N/cm) |
|---|---|---|---|
| C-1 | 1.9 | — | — |
| 1 | 35.0 | 37.1 | 33.6 |

What is claimed is:

1. A barrier film, comprising:
   a substrate;
   a base polymer layer applied to the substrate;
   an oxide layer applied to the base polymer layer; and
   a top coat polymer layer applied to the oxide layer,
   wherein the top coat polymer layer comprises a reaction product of a cyclic aza-silane, an acrylate monomer having a molecular weight in a range of about 150 to about 600 grams per mole, and a surface of the oxide layer.

2. The barrier film of claim 1, further comprising a plurality of alternating layers of the base polymer layer and the oxide layer between the substrate and the top coat polymer layer.

3. The barrier film of claim 1, wherein the substrate comprises a flexible transparent film.

4. The barrier film of claim 1, wherein the base polymer layer comprises an acrylate smoothing layer.

5. The barrier film of claim 1, wherein the oxide layer comprises a layer of an inorganic silicon aluminum oxide.

6. The barrier film of claim 1, further comprising an inorganic layer applied to the top coat polymer layer.

7. The barrier film of claim 6, wherein the inorganic layer comprises a layer of an inorganic silicon aluminum oxide.

8. The barrier film of claim 1, wherein the acrylate monomer has a molecular weight from about 200 to about 400 grams per mole.

9. The barrier film of claim 1, wherein the acrylate monomer is tricyclodecane dimethanol diacrylate.

10. The barrier film of claim 1, wherein the cyclic aza-silane is N-n-butyl-aza-2,2-dimethoxysilacyclopentane.

* * * * *